United States Patent
Yao et al.

(10) Patent No.: US 6,787,484 B2
(45) Date of Patent: Sep. 7, 2004

(54) METHOD OF REDUCING VISIBLE LIGHT INDUCED ARCING IN A SEMICONDUCTOR WAFER MANUFACTURING PROCESS

(75) Inventors: Chih-Hsiang Yao, Hsin-Chu (TW); Yun-Cheng Lu, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 63 days.

(21) Appl. No.: 10/322,412

(22) Filed: Dec. 17, 2002

(65) Prior Publication Data

US 2004/0115943 A1 Jun. 17, 2004

(51) Int. Cl.[7] ..................... H01L 21/425; H01L 21/302; H01L 21/26
(52) U.S. Cl. ..................... 438/795; 438/514; 438/706; 438/725
(58) Field of Search ..................... 438/706, 795, 438/730, 727, 692, 710, 514, 519, 308, 725

(56) References Cited

U.S. PATENT DOCUMENTS

| 4,453,086 | A | * | 6/1984 | Grobman | 250/307 |
| 4,595,837 | A | * | 6/1986 | Wu et al. | 250/492.2 |
| 5,858,879 | A | * | 1/1999 | Chao et al. | 438/725 |
| 6,479,820 | B1 | * | 11/2002 | Singh et al. | 250/310 |
| 6,605,484 | B2 | * | 8/2003 | Janos et al. | 438/22 |

* cited by examiner

Primary Examiner—Ha Tran Nguyen
(74) Attorney, Agent, or Firm—Tung & Associates

(57) ABSTRACT

A method for reducing electrical discharges within semiconductor wafers including providing a semiconductor process wafer comprising at least one dielectric insulating layer including metal interconnects; exposing the semiconductor process wafer to a semiconductor process whereby an electrical charge imbalance accumulates within portions of the semiconductor process water; and, limiting the semiconductor process wafer to exposure of visible light comprising wavelengths greater than a predetermined lower limit for a period of time prior to carrying out a subsequent process to reduce a level of photo-currents generated within the semiconductor process wafer.

20 Claims, 2 Drawing Sheets

METHOD OF REDUCING VISIBLE LIGHT INDUCED ARCING IN A SEMICONDUCTOR WAFER MANUFACTURING PROCESS

FIELD OF THE INVENTION

This invention generally relates to semiconductor wafer photolithographic patterning processes and more particularly to a method for reducing visible light induced charge accumulation and consequential subsequent time dependent dielectric arcing (TDDA) (arcing) phenomena causing damage in microelectronic integrated circuitry.

BACKGROUND OF THE INVENTION

As critical dimensions have become smaller and integrated circuit (IC) integration density increases, charge buildup and arcing has become increasingly problematical in microelectronic IC fabrication processes. For example, as the thickness of dielectric insulating layers is reduced between conductive charge carrying portions of a multi-layer semiconductor device, the electric field strength, which is inversely proportional to the dielectric thickness spanning an electric field caused by electrical charge accumulation, increases dramatically. In many cases, in a multi-layer semiconductor device formed in multiple dies over a semi-conductor wafer process surface, electrical charges may become temporarily trapped in one area and migrate over time to other areas, preferentially accumulating at certain portions of the multi-layer device. For example, surfaces including defects, for example vacancies and interstitials at the surface of a dielectric portion of the multi-layer device may preferentially accumulate electrical charges of one sign, inducing the accumulation of charges of the opposite sign on an opposite surface of a thickness of the dielectric portion creating an electric field. The presence of conductive circuitry, for example formed of copper or alloys thereof, extends throughout the multiple layers of the device allows electrical charge to migrate and preferentially accumulate over time following an electrical charge producing process.

Over time, sufficient charge buildup may occur over a sufficiently thin dielectric portion to create substantial electric field strength which exceeds the dielectric breakdown strength of the dielectric resulting in dielectric breakdown. As a result, certain portions of the integrated circuitry in the device become defective leading to rejection of the device.

One process that leads to electrical charge accumulation in semiconductor devices are plasma enhanced processes such as deposition and etching which produce localized non-uniform charge densities over the semiconductor wafer surface during the plasma enhanced process. The imbalance in electrical charges in both the semiconductor wafer and the plasma may induce electrical discharge arcing damaging the semiconductor wafer process surface. For example, charge accumulated over time and trapped within the semiconductor device may provide a source of charge imbalance and subsequent arcing during the plasma process.

The problem of dielectric breakdown has been enhanced by the increasing use of low-k (dielectric constant) materials. For example, many of the low-k materials, including carbon doped silicon oxide are porous, have lower mechanical strength, and may be prone to a higher degree of charge buildup through charge trapping processes. Consequently, the factors of thinner dielectric layer portions, higher electrical charge densities and lower dielectric breakdown strength combine to enhance the incidence and susceptibility to dielectric breakdown. In addition, electric discharges such as arcing more easily produces damage within such dielectrics, creating areas of localized micro-cracking.

Arcing damage frequently occurs in the dielectric insulator/metal conductor interfaces, where conductive interconnect lines provide an electrical pathway to preferentially move electrical charges to produce localized charge imbalance regions in the various dielectric insulating layers. The problem is critical since the damage caused by arcing is frequently severe enough to make further processing of the wafer impractical or seriously impact reliability. As a result, arcing damage to the wafer is costly in terms of wafer yield and reliability.

There are a number of semiconductor manufacturing processes that are associated with producing charge imbalances within portions of a semiconductor process wafer during the course of manufacturing multiple layers of device circuitry. The prior art has not sufficiently addressed methods to reduce or avoid time dependent dielectric arcing (TDDA) as the problem has not become sufficiently acute until recently as critical dimensions approach 0.1 micron and below. TDDA has been associated with the apparent spontaneous occurrence of dielectric arcing events over time in the presence of no discernable triggering events.

There is therefore a need in the semiconductor processing art to develop semiconductor manufacturing processes including a method whereby electrical charge imbalance accumulation in semiconductor devices is reduced such that arcing including time dependent dielectric arcing (TDDA) is reduced or avoided thereby improving device yield and reliability.

It is therefore an object of the invention to provide a method whereby electrical charge imbalance accumulation in semiconductor devices is reduced such that arcing including time dependent dielectric arcing (TDDA) is reduced or avoided thereby improving device yield and reliability while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for reducing electrical discharges within semiconductor wafers.

In a first embodiment, the method includes providing a semiconductor process wafer comprising at least one dielectric insulating layer including metal interconnects; exposing the semiconductor process wafer to a semiconductor process whereby an electrical charge imbalance accumulates within portions of the semiconductor process wafer; and, limiting the semiconductor process water to exposure of visible light comprising wavelengths greater than a predetermined lower limit for a period of time prior to carrying out a subsequent process to reduce a level of photo-currents generated within the semiconductor process wafer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
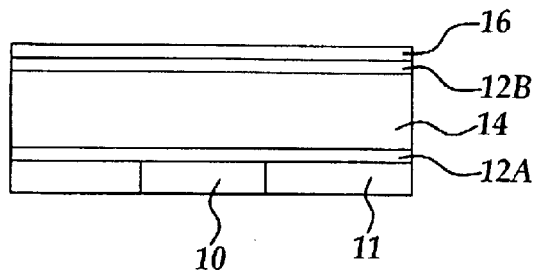
FIGS. 1A–1D are cross sectional side view representations of an exemplary portion of a semiconductor wafer at stages of manufacture according to the present invention.

Although the present invention is explained by exemplary reference to the photolithographic patterning step of a particular level of a multi-level (multi-layer) semiconductor device it will be appreciated that the method of the present invention directed to avoiding charge accumulation over time to trigger electrical discharges within a microelectronic integrated circuit according to semiconductor wafer processes may be advantageously applied following any electrical charge imbalance producing semiconductor wafer process such as ionizing radiation lithographic processes, including electron and photon lithography, plasma assisted processes such as deposition or etching processes, and CMP processes to produce electrostatic charge imbalances. It will further be appreciated that the charge accumulation prevention treatment, while explained, and particularly advantageously used for, devices including low-k dielectric materials such as carbon doped oxide, it will be appreciated that the method of the present invention may in general be advantageously used with all types of dielectric insulating material included in semiconductor devices where accumulated electrical charge imbalances lead to electrical discharge arcing and which may be advantageously reduced or avoided according to embodiments of the present invention.

In one embodiment of the present invention, a semiconductor process wafer including at least one dielectric layer and having metal conductive lines formed in the at least one dielectric layer is subjected to an electrical charge imbalance producing process. Following the charge imbalance producing process, the semiconductor wafer is exposed to a controlled photo-current producing visible light environment to reduce. Preferably induced photo-currents are substantially eliminated within the semiconductor process wafer. By the term 'induced photo-currents' is meant a photo-activated process of exciting electrons or holes from a non-conducting state to a conducting state to produce a movement of charges.

In a preferred embodiment, the charge imbalance producing process is included in lithographic process including for example, electron or photon lithography. For example, the lithographic process is a deep ultraviolet (DUV) photolithographic process where a light source including wavelengths of less than about 250 nm are used to expose a photoresist layer over the semiconductor process wafer surface.

It has been unexpectedly found according to the present invention that exposure of a semiconductor process wafer to visible light including wavelengths of below about 560 nm increases the incidence of time dependent dielectric arcing (TDDA) following a charge imbalance producing process. For example, it is believed that exposure of the semiconductor wafer to a photo-current producing visible light source produces photo-induced currents and increases electrical charge imbalances in the semiconductor wafer over time. It has also been found that following a lithographic process, for example a deep ultraviolet (DUV) exposure process, charge imbalances, for example an excess of negative charge accumulates in both the photoresist layer and the dielectric layer portions of a semiconductor process waver. Subsequent exposure of the semiconductor wafer to photo-current producing visible light is believed to trigger and has been found to increase the incidence of TDDA events, leading to dielectric breakdown in areas of a device causing damage and defective functioning circuitry.

For example, the semiconductor process wafer includes multiple levels of dielectric layers including conductive metal interconnect pathways which form a portion of the device integrated circuitry. Following DUV exposure in a photolithographic process, subsequent exposure of the semiconductor process wafer to commonly used visible light sources including wavelengths less than about 560 nm is believed to cause photo-induced charge creation and/or movement of electrical currents in material included in the semiconductor process wafer, including a photoresist layer. As a result, photo-induced charges and currents lead to an accumulation of charge imbalances within portions of the wafer over time and are believed to trigger dielectric breakdown events within portions of the wafer. TDDA has been heretofore thought to be associated with a spontaneous arcing process, but according to findings leading to the present invention, is believed to be triggered by exposure to photo-current producing visible light, for example including wavelengths of less than about 560 nm. The presence of metal interconnects, for example copper interconnects such as vias and trench lines, are believed to assist the transport of photo-currents in the circuitry of the semiconductor device leading to electric discharge arcing causing dielectric breakdown damage. For example, electrical charges present or produced following the charge imbalance producing process are believed to accumulate and migrate over time eventually reaching a critical electrical field strength and triggering dielectric breakdown across dielectric interfaces including areas not directly exposed to the photo-current producing visible light source.

Although the precise process leading to the enhancement of TDDA due to exposure of a process wafer to visible light sources less than about 560 nm is not fully understood, regardless of the precise mechanism, it has been found that controlling the exposure a semiconductor process wafer to a reduced (controlled) photo-current producing light environment, for example limited to wavelengths greater than about 560 nm following charge imbalance producing semiconductor device fabrication processes, particularly following DUV photolithography, reduces the incidence of TDDA events and consequent device damage.

For example, following a DUV photolithographic process, semiconductor wafers are stored or transferred in various types of wafer holding apparatus such as wafer stockers, wafer carriers, wafer holding pods and the like, as they are queued in preparation for another process. Many of the wafer holding apparatus include light transmitting materials and are exposed to a visible light producing environment including photo-current producing wavelengths, for example less than about 560 nm. According to one embodiment of the present invention, a controlled visible light environment to reduce a production of photo-currents is provided such that following the DUV photolithographic process, the process wafers are exposed to a controlled visible light environment, at least during a queue time, preferably limited to wavelengths greater than about 560 nm, more preferably limited to wavelengths between about 560 nm and about 620 nm. Even more preferably, the wafers are limited to exposure to wavelengths between about 590 and 600 nm, corresponding to a yellow light source.

For example, semiconductor wafer processing environments typically include a source of visible light including wavelengths of less than about 560 nm, for example even including some UV wavelengths, for example in the case of fluorescent lighting sources. As a result, during wafer movement or queuing (putting in a wafer holding means) the semiconductor wafers are exposed to fluxes of photo-current producing light. According to exemplary implementations of the present invention, for example, a controlled visible light environment is provided whereby the visible source of light in a semiconductor processing environment is preferably limited to producing and/or transmitting wavelengths according to the preferred embodiments. In another embodiment, the controlled visible light environment is provided to limit the visible light wavelengths incident on the process wafer. For example, the controlled visible light environment may be provided by light filtering means disposed between the visible light source and the semiconductor wafers. For example, selectively formulated light transmitting materials (filters) as are known in the art may be placed between the visible light source and the semiconductor process wafers, including placing such light filtering materials over the visible light source, constructing the wafer holding apparatus to include such light filtering material, such as light filtering plastics, or including a coating of filtering material over the visible light source and/or over light transmitting portions of the wafer holding apparatus. Additionally, or alternatively, the controlled visible light environment may include visible light sources formed to produce a range of wavelengths according to preferred embodiments by including appropriate fluorescent materials as are known in the fluorescent light art.

In an exemplary semiconductor process according to an embodiment of the present invention, referring to FIGS. 1A–1D, are shown cross sectional portions of a semiconductor process wafer at stages in an exemplary manufacturing process. Referring to FIG. 1A is shown a conductive region 10, for example, copper, formed in a dielectric insulating layer 11 having an overlying first etching stop layer 12A, for example, silicon nitride (e.g., $Si_3N_4$). First etching stop layer 12A is formed by a conventional chemical vapor deposition (CVD) process including for example, LPCVD (low pressure CVD), having a thickness of about 300 Angstroms to about 700 Angstroms.

Still referring to FIG. 1A, formed over etching stop layer 12A is first dielectric insulating layer 14, also referred to as an inter-metal dielectric (IMD) layer formed of, for example, fluorinated silicate glass (FSG) or a low-k (low dielectric constant) silicon oxide based material, e.g., carbon doped silicon dioxide, preferably having a dielectric constant of less than about 3.5. Typically, the first IMD layer 14 is formed having a thickness of about 3000 to about 7000 Angstroms.

Still referring to FIG. 1A, following deposition of the first IMD layer 14, a second etching stop layer 12B is formed in a similar manner to first etching stop layer 12A, formed of, for example, silicon nitride (e.g., $Si_3N_4$) by an LPCVD process, having a thickness of about 300 Angstroms to about 600 Angstroms. Formed over second etching stop layer is a bottom anti-reflectance coating (BARC) layer 16 to reduce undesired light reflections from the second IMD layer surface during a subsequent photolithographic patterning process. For example, the BARC is formed of silicon oxynitride (e.g., SiON) according to an LPCVD process having a thickness of about 1000 to about 1400 Angstroms.

Figure 1B:
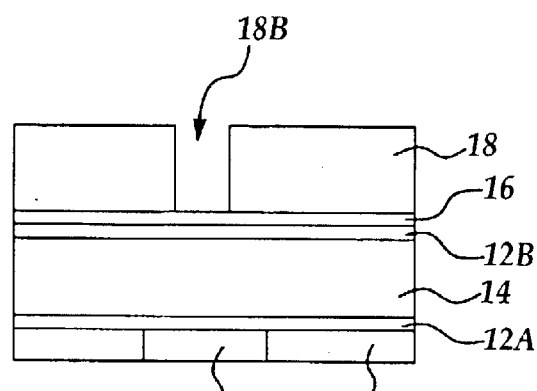
Figure 1C:
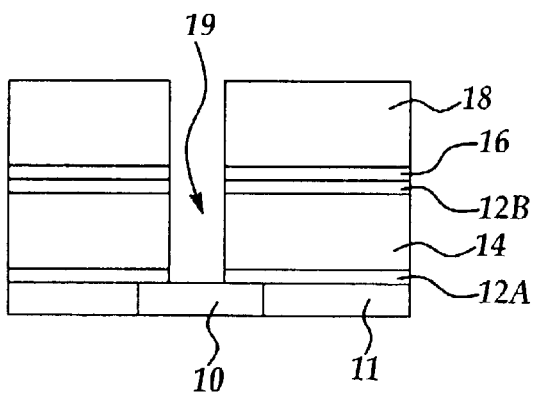

Referring to FIG. 1B, a photoresist layer 18 is formed over the BARC layer 16 by a conventional spin-coating method, for example, having a thickness of about 8,000 to about 12,000 Angstroms. It will be appreciated that the photoresist may be any type of photoresist, for example a deep ultraviolet (DUV) photoresist including a photogenerated acid. In addition, the photoresist layer may be a multi-layer photoresist, for example the uppermost layer of the photoresist being subjected to silylation process after exposure and developed by a plasma process. The photoresist layer is exposed to a UV light source, including light wavelengths of at least less than about 400 nm, more preferably, a deep ultraviolet (DUV) light source including wavelengths lower than about 250 nm. The photoresist layer is subsequently developed to form a feature opening pattern, e.g., 18B.

Figure 2:
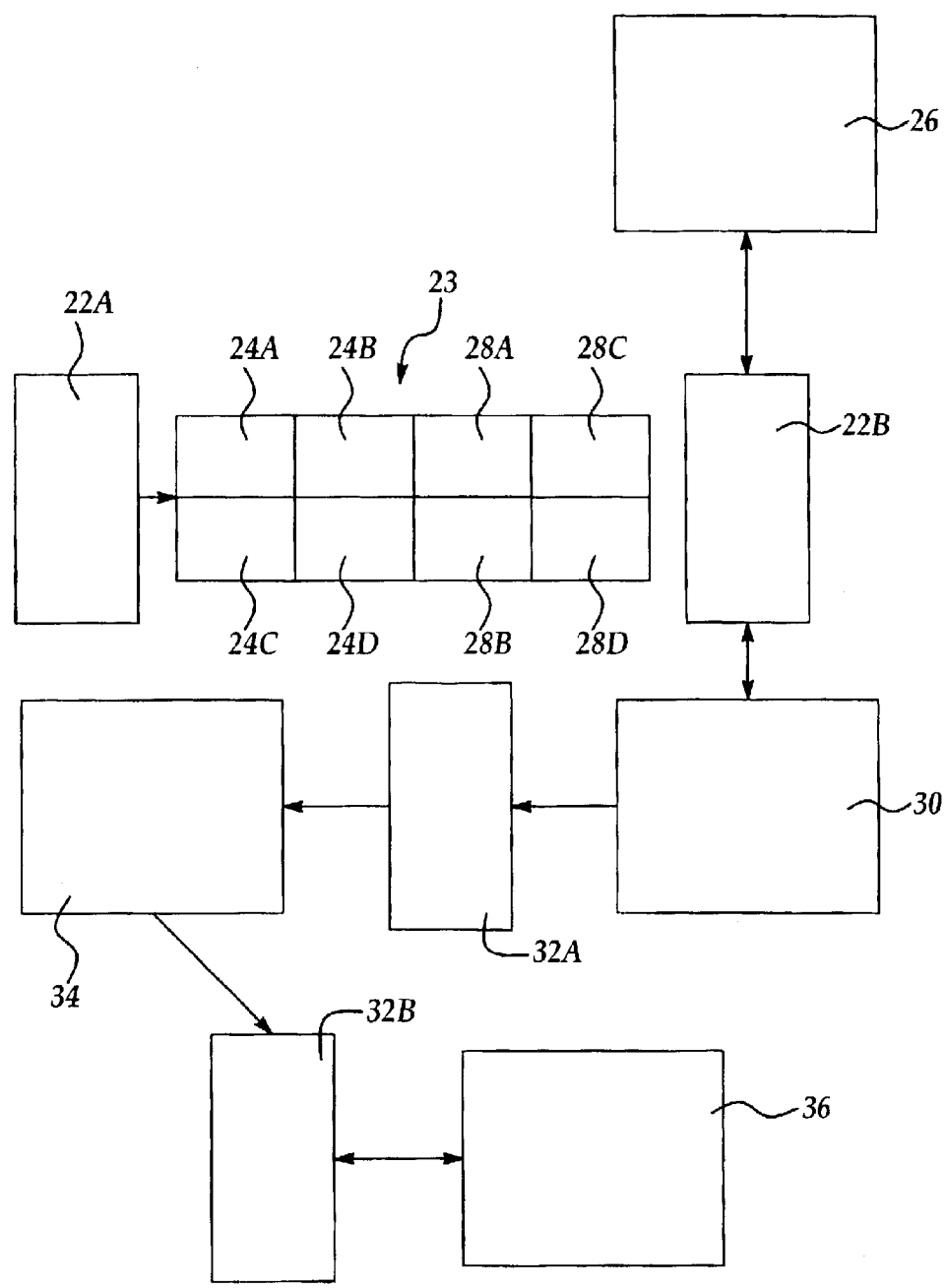
FIG. 2 is a schematic of an exemplary manufacturing process flow according to an embodiment of the present invention.

Referring to FIG. 2, is shown a schematic of an exemplary photolithographic patterning process. Semiconductor wafers are transferred to a wafer loading station 22A, adjacent a photolithographic wafer track system 23 where process wafers are queued in wafer holding means, while waiting for individual processing along the track system according to robotic arm transfer. For example, the wafer track system includes a resist coating process including stations for vapor priming the wafer 24A, followed by resist coating 24B, a softbake 24C, and a wafer cooling station 24D. Following the resist coating process (stations 24A–24D), the wafer is moved to a transfer station 22B for queuing in wafer holders prior to being transferred to a photoresist exposure process, for example a step and scan process in station 26 at wavelengths less than about 250 nm. Preferably, at least the transfer station 22B includes a controlled visible light environment to limit the wavelengths of light the semiconductor process wafers are exposed to according to preferred embodiments. Following the photoresist exposure process at station 26, the process wafer is robotically transferred back to the transfer station 22B for transfer to another series of wafer track processes in wafer track system 23. For example, individual wafers are queued at wafer transfer station 22B while awaiting processing along wafer track photoresist development process including a post exposure bake station 28A, followed by a wafer cooling station 28B, followed by a develop and rinse station 28C and edge bead removal station 28D. Following the photoresist development process, the wafer is again transferred to wafer transfer station 22B for queuing while awaiting the next process. The wafer transfer station 22B, for example, includes a wafer queuing (holding) means, for example a wafer stocker or a wafer carrier to hold the wafers in a controlled visible light environment in preparation for the next process. For example, the wafer is transferred from process station 22B for an optical inspection process 30 by scanning electron or optical microscopy to verify critical dimensions of patterned semiconductor features. Following the wafer inspection process the wafers for example are transferred to a second wafer queuing means 32A including a controlled visible light environment according to preferred embodiments to await the next process, for example a plasma enhanced etching process 34 such as a reactive ion etching (RIE) process.

Referring back to FIG. 1C, a conventional reactive ion etching (RIE) process is carried out to form anisotropically etched opening 19, for example, a via opening. For example, the anisotropic etching step includes sequential etching steps including conventional plasma etching chemistries formed of combinations of gases including hydrofluorocarbons, fluorocarbons, nitrogen, and oxygen to sequentially etch through a thickness of the BARC layer 16, the etching stop layer 12B, the IMD layer 14, and a portion of the etching stop layer 12A.

Figure 1D:
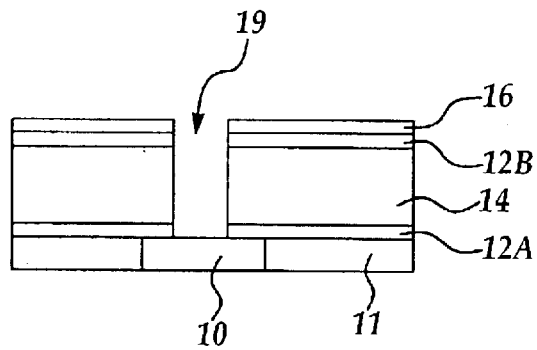

Referring to FIG. 1D, following the RIE process, a plasma ashing process, for example including an oxygen containing plasma chemistry is used to remove the photoresist layer 18 and to remove residual polymeric material from the via opening. Referring again to FIG. 2, following the RIE and ashing processes in plasma process station 34, the process wafer is preferably transferred to a third wafer queuing means 32B including a controlled visible light environment, for example a wafer holding container or wafer transfer station, to await a next process, for example a chemical wet etching process 36 to remove remaining etching residues from the process wafer surface. Following the wet etching process including cleaning and drying the process wafer is transferred back to the wafer queuing means 32B.

According to an embodiment of the present invention, controlled visible light environment is provided during process wafer transfer and/or queuing following a charge imbalance producing process, for example a photolithographic photo-exposure process. The controlled visible light environment is selected to have reduced photo-current producing wavelengths according to preferred embodiments. For example, it has been found that the beneficial effects of reducing TDDA events according to embodiments of the present invention are most advantageously utilized following a photolithographic exposure process, including light wavelengths of less than about 400 nm, and particularly DUV wavelengths, for example less than about 250 nm. However, benefit is additionally realized by providing a reduced photo-current producing visible light environment (controlled visible light environment) following other charge imbalance producing processes including plasma enhanced processes such as etching and deposition processes as well as CMP processes. As such, the benefits of the present invention are advantageously realized by providing a semiconductor wafer production line with a controlled visible light environment having reduced photo-current producing wavelengths according to preferred wavelengths. However, the benefits may additionally be realized by providing queuing stations and wafer holding apparatus with the preferred controlled visible light environment, for example, by controlling a wavelength of transmitted light incident on the process wafers during at least the queuing period.

Figure 3:
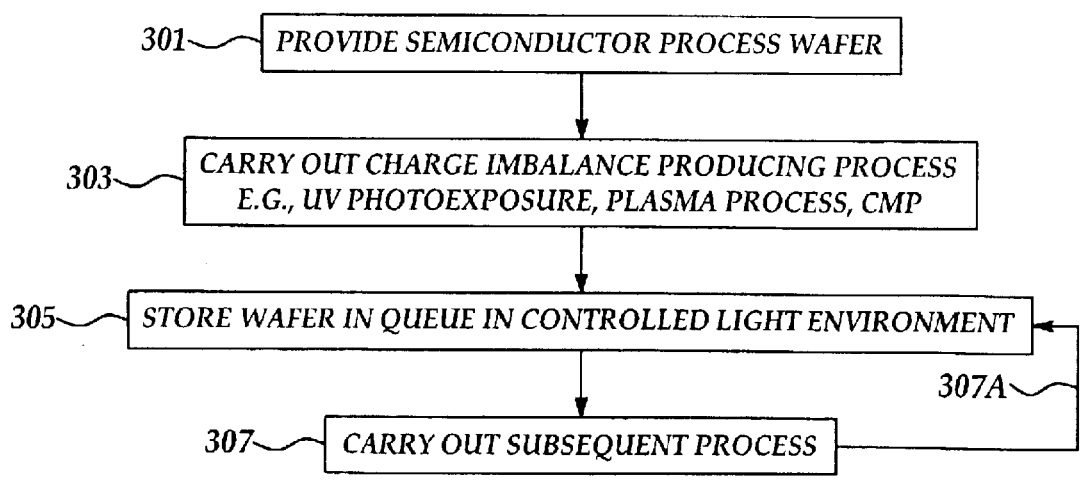
FIG. 3 is an exemplary process flow diagram including several embodiments of the present invention.

Referring to FIG. 3 is shown a process flow diagram including several embodiments of the present invention. In process 301 a semiconductor wafer process wafer including at least one dielectric insulating layer having metal (e.g., copper) interconnects is provided including at least one photoresist overlayer for forming a photolithographic pattern. In process 303, a charge imbalance producing process such as a photolithographic patterning process is carried out including exposure of the at least one photoresist overlayer to an activating radiation source having a wavelength of less than about 400 nm, preferably less than about 250 nm. In process 305, the semiconductor wafer is transferred to a controlled visible light environment wafer queuing means, for example a wafer holding means where the light incident on the semiconductor process wafers is controlled to limit a wavelength of light to greater than about 560 nm, more preferably about 560 to 620 nm, most preferably from about 590 to about 600 nm. In process 307, a subsequent wafer manufacturing process is carried out, for example including a subsequent photolithographic patterning process including an inspection process. It will be appreciated that the subsequent process may include another charge imbalance producing process such as a plasma etching process or a chemical mechanical polish (CMP) process. As indicated by process directional arrow 307A following the subsequent process the semiconductor is transferred to a controlled visible light environment wafer queuing means in process 305, prior to a subsequent semiconductor wafer manufacturing process as in process 307.

Thus, there has been presented a method whereby the accumulation and distribution of charge imbalances over time is reduced to reduce or avoid electrical discharges (arcing) also known as time dependent dielectric arcing (TDDA). As a result, arcing induced defects in the semiconductor wafer are reduced to improve wafer yield and device reliability while overcoming other shortcomings and deficiencies of the prior art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing electrical discharges within semiconductor wafers comprising the steps of:
   providing a semiconductor process wafer comprising at least one dielectric insulating layer including metal interconnects;
   exposing the semiconductor process wafer to a semiconductor process whereby an electrical charge imbalance accumulates within portions of the semiconductor process wafer; and,
   limiting the semiconductor process wafer to exposure of visible light comprising wavelengths greater than a predetermined lower limit for a period of time prior to carrying out a subsequent process to reduce a level of photo-currents generated within the semiconductor process wafer.

2. The method of claim 1, wherein the semiconductor process includes at least one of a lithographic patterning process, a plasma assisted process, and a chemical mechanical polishing process.

3. The method of claim 2, wherein the semiconductor process comprises a photolithographic process comprising exposure to radiation having wavelengths of less than about 400 nm.

4. The method of claim 3, wherein the semiconductor process comprises a photolithographic process comprising exposure to radiation having wavelengths of less than about 250 nm.

5. The method of claim 3, whereby the electrical charge imbalances accumulates upon exposure of a photoresist layer overlying the at least one dielectric insulating layer.

6. The method of claim 1, wherein the visible light is limited to wavelengths of greater than about 560 nm.

7. The method of claim 1, wherein the visible light is limited to wavelengths of between about 560 nm and about 620 nm.

8. The method of claim 1, wherein the visible light is limited to wavelengths of between about 590 nm and about 600 nm.

9. The method of claim 1, wherein the step of limiting comprises at least one of transporting and storing the semiconductor process wafer.

10. The method of claim 1, wherein the step of limiting comprises providing a light filtering means between a visible light source and the semiconductor process wafer.

11. The method of claim 1, wherein the step of limiting comprises providing a light source limited to producing wavelengths greater than the predetermined lower limit.

12. The method of claim 1, wherein the at least one dielectric layer comprises carbon doped oxide and the metal interconnects comprise copper.

13. The method of claim 1, wherein the at least one dielectric layer comprises features having a critical dimension of less than about 0.25 microns.

14. A method for reducing time dependent dielectric arcing (TDDA) within a semiconductor process wafer comprising the steps of:
exposing a photoresist layer overlying the semiconductor process wafer to a source of activating radiation;
limiting the semiconductor process wafer exposure to visible light comprising wavelengths greater than a predetermined lower limit for a period of time prior to carrying out a subsequent process to reduce a level of photo-currents generated within the semiconductor process wafer.

15. The method of claim 14, wherein the activating radiation comprises wavelengths of less than about 400 nm.

16. The method of claim 15, wherein the activating radiation comprises wavelengths of less than about 250 nm.

17. The method of claim 15, wherein the visible light is limited to wavelengths of greater than about 560 nm.

18. The method of claim 1, wherein the visible light is limited to wavelength of between about 560 nm and about 620 nm.

19. The method of claim 1, wherein the visible light is limited to wavelength of between about 590 nm and about 600 nm.

20. The method claim 1, wherein the step of limiting comprising providing means least one of a light filtering means or a light producing means and the period of time comprises at least one of transporting and storing the semiconductor process wafer.

* * * * *